United States Patent
Garg et al.

(10) Patent No.: US 8,730,713 B2
(45) Date of Patent: May 20, 2014

(54) SRAM CELL WRITABILITY

(75) Inventors: Manish Garg, Morrisville, NC (US); Michael ThaiThanh Phan, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 33 days.

(21) Appl. No.: 13/551,658

(22) Filed: Jul. 18, 2012

(65) Prior Publication Data

US 2013/0064004 A1    Mar. 14, 2013

Related U.S. Application Data

(60) Provisional application No. 61/533,771, filed on Sep. 12, 2011, provisional application No. 61/533,806, filed on Sep. 13, 2011.

(51) Int. Cl.
    *G11C 11/00*    (2006.01)
(52) U.S. Cl.
    USPC .......................................... 365/154; 365/205
(58) Field of Classification Search
    USPC ................................................ 365/154, 205
    See application file for complete search history.

(56) References Cited

U.S. PATENT DOCUMENTS

| | | | |
|---|---|---|---|
| 7,733,686 B2 | 6/2010 | Clinton | |
| 2009/0040846 A1* | 2/2009 | Chang | 365/194 |
| 2010/0165754 A1 | 7/2010 | Gupta et al. | |
| 2010/0329054 A1 | 12/2010 | Azimi et al. | |
| 2011/0026309 A1 | 2/2011 | Kumar et al. | |
| 2011/0063932 A1 | 3/2011 | Chandra et al. | |
| 2011/0085389 A1 | 4/2011 | Khellah et al. | |
| 2011/0149668 A1 | 6/2011 | Kumar et al. | |
| 2011/0317508 A1 | 12/2011 | Kulkarni et al. | |

OTHER PUBLICATIONS

International Search Report and Written Opinion—PCT/US2012/054906—ISA/EPO—Dec. 6, 2012.

* cited by examiner

*Primary Examiner* — Michael Tran
(74) *Attorney, Agent, or Firm* — Peter Michael Kamarchik; Nicholas J. Pauley; Joseph Agusta

(57) ABSTRACT

Systems and methods for detecting and improving writeability of a static random access memory (SRAM) cell. A bias voltage value corresponding to an operating condition, such as, a process, a voltage, or a temperature operation condition that indicates a cell write failure condition of an external SRAM array comprising the SRAM cell is generated. This bias voltage value is applied to word lines of SRAM cells in a model SRAM array. A first delay for a trigger signal rippled through the model SRAM array is detected and compared to a reference delay. A write assist indication is generated if the first delay is greater than or equal to the reference delay. Based on the write assist indication, a write assist is provided to the SRAM cell.

22 Claims, 5 Drawing Sheets

SRAM CELL WRITABILITY

CLAIM OF PRIORITY UNDER 35 U.S.C. §119

The present application for patent claims priority to Provisional Application No. 61/533,771 entitled "SENSOR CIRCUIT FOR DETECTING SRAM CELL WRITABILITY" filed Sep. 12, 2011, and assigned to the assignee hereof and hereby expressly incorporated by reference herein. The present application for patent also claims priority to Provisional Application No. 61533806 entitled "SENSOR CIRCUIT FOR DETECTING SRAM CELL WRITABILITY" filed Sep. 13, 2011, and assigned to the assignee hereof and hereby expressly incorporated by reference herein.

TECHNICAL FIELD

This disclosure relates to electronic memory operation and more specifically to detecting and improving static random access memory (SRAM) cell writability.

BACKGROUND

Semiconductor memory devices include, for example, static random access memory (SRAM) and dynamic random access memory (DRAM). A DRAM memory cell generally includes one transistor and one capacitor, thereby providing a high degree of integration. DRAM, however, requires constant refreshing, which limits use of DRAM to computer main memory. An SRAM memory cell, by contrast, is bi-stable, meaning that it can maintain its state indefinitely, so long as an adequate power is supplied. SRAM also supports high speed operation, with lower power dissipation, which is useful for computer cache memory.

One example of an SRAM memory cell is a six transistor (6T) SRAM memory cell that includes six metal-oxide-semiconductor (MOS) transistors. As processes for fabricating MOS devices migrate to nanometer technologies, the use of conventional 6T SRAM cells within processor cache memories prohibits compliance with performance requirements. To meet these performance requirements, eight transistor (8T) SRAM cells are being used in place of the 6T SRAM cells. Use of an 8T SRAM cell may enable independent sizing of the devices on the read and write ports of the memory cell for supporting a lower minimum write voltage ($V_{min}$), while enabling a high performance read operation.

However, process variations in nanometer technology on read port devices for large size SRAM cache memory arrays may lead to weak bits. A weak bit is a memory cell that has a relatively low current capacity as compared to a normal bit due to process/voltage/temperature (PVT) device variations. Unfortunately, the use of 8T SRAM memory cells does not overcome the effect of weak bits in conventional implementations Accordingly, there is a need in the art for overcoming aforementioned drawbacks associated with weak bits while maximizing the benefits of 8T SRAM cells.

SUMMARY

Exemplary embodiments of the invention are directed to systems and method for detecting and improving static random access memory (SRAM) cell writability.

For example, an exemplary embodiment is directed to a method of improving writeability of a static random access memory (SRAM) cell. The method comprising generating a bias voltage value corresponding to an operating condition of an external SRAM array comprising the SRAM cell, applying the bias voltage value to word lines of SRAM cells in a model SRAM array, detecting a first delay for a trigger signal rippled through the model SRAM array, comparing the first delay to a reference delay, and generating a write assist indication if the first delay is greater than or equal to the reference delay.

Another exemplary embodiment is directed to an apparatus comprising: control logic to detect a condition in which a simulated write delay within a model static random access memory (SRAM) array exceeds a programmable delay value, in which an output of the control logic is to enable a write assist in an external SRAM array.

Yet another exemplary embodiment is directed to a system for improving writeability of a static random access memory (SRAM) cell present in an external SRAM array, the system comprising means for detecting a condition in which a simulated write delay within a model static random access memory (SRAM) array exceeds a programmable delay value, in which an output of the control logic is to enable a write assist in the external SRAM array.

Another exemplary embodiment is directed to a non-transitory computer-readable storage medium comprising code, which, when executed by a processor, causes the processor to perform operations for improving writeability of a static random access memory (SRAM) cell, the non-transitory computer-readable storage medium comprising code for generating a bias voltage value corresponding to an operating condition of an external SRAM array comprising the SRAM cell, code for applying the bias voltage value to word lines of SRAM cells in a model SRAM array, code for detecting a first delay for a trigger signal rippled through the model SRAM array, code for comparing the first delay to a reference delay, and code for generating a write assist indication if the first delay is greater than or equal to the reference delay.

BRIEF DESCRIPTION OF THE DRAWINGS

For a more complete understanding of the present disclosure, reference is now made to the following descriptions taken in conjunction with the accompanying drawings.

DETAILED DESCRIPTION

Figure 1:
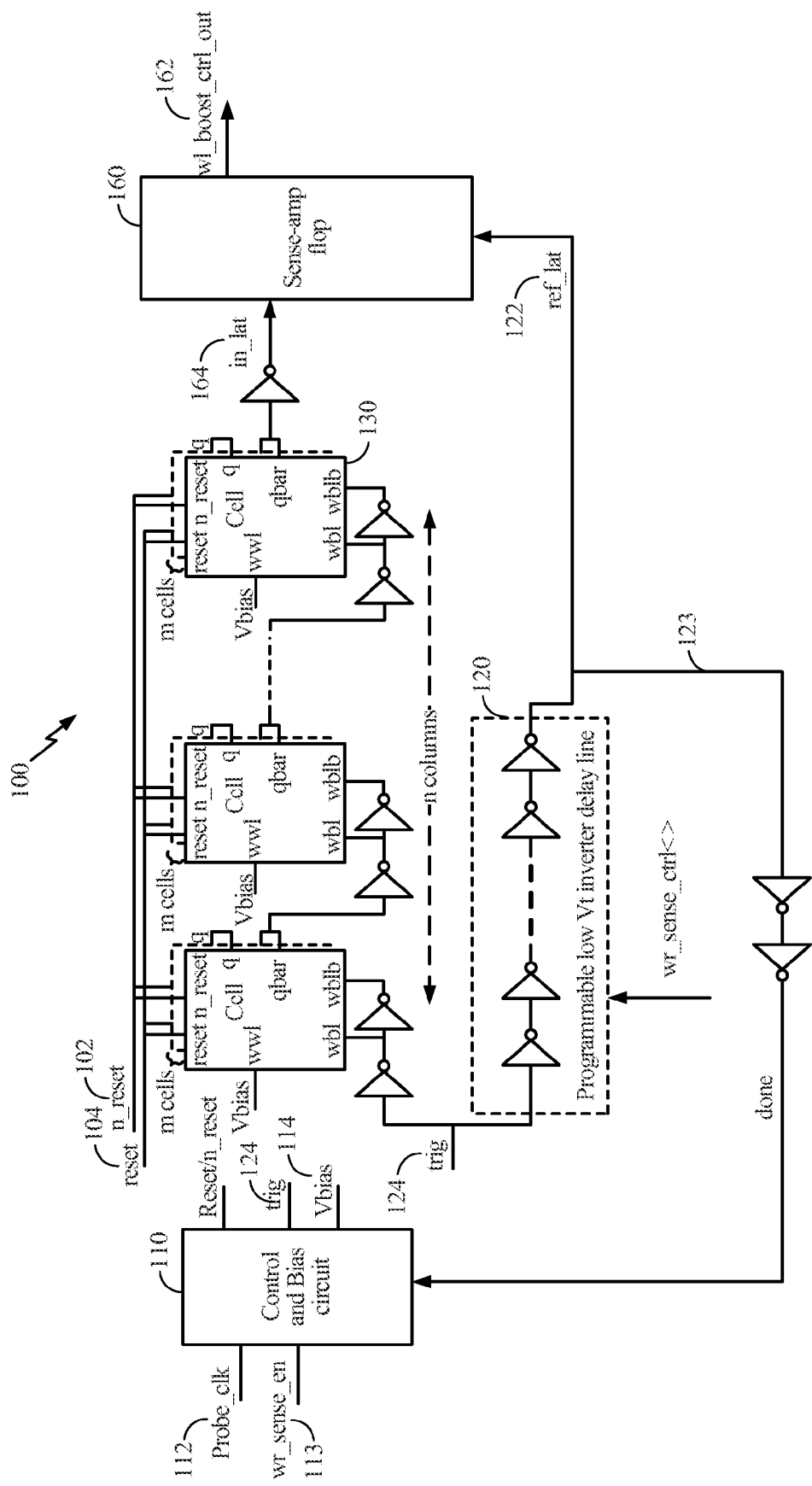
FIG. 1 is a circuit diagram illustrating a write sensor for controlling operation of a write word-line voltage boost according to an aspect of the present disclosure.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic conFIG. d to" perform the described action.

Eight-transistor (8T) static random access memory (SRAM) cells are commonly used in single rail CPU (central processing unit) designs. 8T SRAM cells are used in single rail CPU designs because they support dynamic voltage scaling (DVS) and fast read access. 8T SRAM cells also allow the read performance in a register file type design of level 0/level 1 (L0/L1) cache memories to track with a logic device performance. Even though an 8T read port can be independently sized for a high read current, the associated cost in terms of area and leakage becomes a significant part of the CPU budget for large size L0/L1 cache memory arrays.

As previously mentioned, a weak bit is a memory cell that has a relatively low current capacity as compared to a normal bit due to process/voltage/temperature (PVT) device variations. The cell current of a weak bit can affect and degrade the performance of an SRAM cache memory. In particular, due to the increased mismatch in nanometer technologies, a weak SRAM bit has a higher voltage sensitivity due to a higher threshold voltage, resulting in a performance degradation that is higher than a logic device performance degradation due to supply noise. The increased process variation also limits a minimum writability voltage ($V_{min}$) of the 8T cells that sets the overall minimum operation voltage, $V_{min}$, for singe rail CPUs.

In nanometer silicon technologies, the read/write margins for memory cells are diminishing due to increased process variations. Various circuit assist techniques are commonly used to maintain scalability of the memory cells. The circuit assist techniques are also needed to improve the $V_{min}$ of the memory cell which is important for enable dynamic voltage scaling (DVS) on circuits incorporating the memory cells. A low DVS is important for low power operation of a mobile CPU that uses SRAM arrays.

A mobile CPU may specify an aggressive power specification; therefore, lowering the 8T cell $V_{min}$ is important. In a mobile CPU that includes an 8T memory cell, with separate read and write ports, a cell write $V_{min}$ and a read current may be improved by boosting a word-line (WL) voltage. In particular, one technique to improve the read/write margin is to raise the word-line (WL) voltage relative to memory cell voltage. The word line voltage can be raised by creating a high voltage island for the memory cell. The voltage island, however, has a high design cost in terms of area, performance and power due to need of a level shifter and the need of additional high voltage supply. The higher voltage supply can also be generated on-chip using charge pump circuits; however they also consume significant area and power. B raising the WL voltage, a write margin and a read current of the weak bit cell are significantly improved. Hence, there is an area and a power cost involved with implementing a boosting scheme. Furthermore, gate oxide reliability can be an issue if the WL is boosted beyond the highest voltage allowed in the technology.

In one exemplary embodiment, a write sensor (WS) circuit can be used to control a dynamic write assist scheme. In this embodiment, the WS circuit can detect the PVT conditions where the cell writability is degraded and the output of the WS circuit can be used to enable write assist such as a word-line boost. Under the WS circuit control, the write assist in the form of a word-line boost can be enabled when a central processing unit (CPU) and/or a memory array voltage is low. This selective enabling of such a write assist can reduce the overall power consumption of the CPU operating under DVS. Since the write assist is disabled at high voltage operation, device reliability issues can be avoided. Techniques for providing selective enabling of write assist in the form of word-line boost in exemplary embodiments will now be described with regard to FIGS. 1-3.

With reference to FIG. 1, a circuit diagram for write sensor (WS) circuit 100 according to an exemplary embodiment is illustrated. As illustrated, WS circuit 100 can be used to sense PVT conditions in which a write assist comprising word-line boost is enabled.

According to the configuration of WS circuit 100 shown in FIG. 1, write ripple delay (in_lat) 164 is compared with another delay (ref_lat) 122 through a programmable logic gate delay line 120. This comparison can be representative of conditions wherein the aforementioned CPU and/or memory array voltage is low and writability of a corresponding 8T SRAM cell in an external SRAM array is detected to be degraded based on PVT conditions. The result of the comparison is captured in sense-amp type fast latch 160 to generate output word-line boost control 162. It will be understood that the term "external SRAM array" is merely used to convey that the external SRAM array is external to WS circuit 100. More particularly, WS circuit 100 and external SRAM array may be integrated on a same chip.

Figure 2:
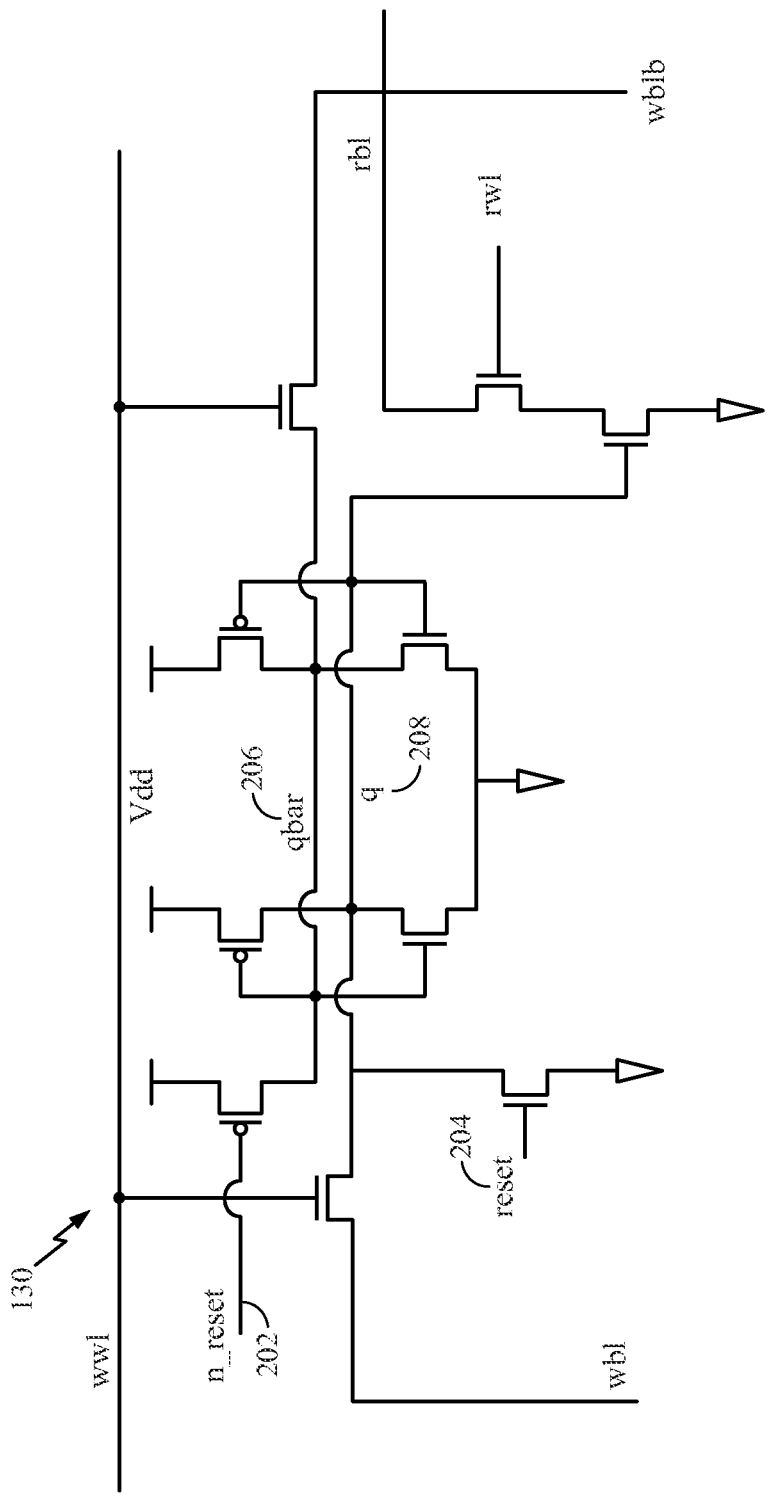
FIG. 2 is a circuit diagram illustrating an eight transistor (8T) static random access memory (SRAM) cell that includes a reset node according to an aspect of the present disclosure.

Shown in FIG. 1 is a model array of eight transistor (8T) static random access memory (SRAM) cells 130. This model array of 8T SRAM cells 130, configured as part of WS circuit 100, may be used to imitate behavior of weak cells in an external SRAM array (not shown). A detailed view of an individual SRAM cell 130 is provided in FIG. 2. Accordingly, with combined reference to FIGS. 1-2, SRAM cell 130 can include reset port 204 and n_reset port 202 which are coupled to the signals, reset 104 and n_reset 102 of WS circuit 100 respectively. As shown in FIG. 2, SRAM cell 130 can include a storage element (such as two cross-coupled inverters) whose gates are coupled to corresponding reset port 204 and n_reset port 202, and eventually to signals reset 104 and n_reset 102. Write bit-lines wbl and WW1) can be used to write to the storage element once the particular SRAM cell 130 is selected via write word line wwl. Read bit-line rbl can be used to read out of the storage element once the particular SRAM cell 130 is selected using read word line rwl. The operation of SRAM cell 130 can be understood by one skilled in the art.

In the illustrated configuration of FIG. 1, the model array comprising SRAM cells 130 can be configured as a logical m×n array. Representatively, Ell cells such as SRAM cell 130 in each of the n columns can be connected in parallel by tying each of their storage nodes q 208 together and each of their storage nodes qbar 206 together. Tying storage nodes q 208 and qbar 206 in this manner may average out random variations in individual SRAM cells 130. Tied together, qbar 206 may be formed as a common storage node for all m cells in a column, and this common storage node q bar 206 in one column can drive an inverter pair, and in turn, the inverter pair can drive bit-lines wbl and wbib of a next column.

With continued reference to FIG. 1, control and bias circuit 110 can be used to generate a voltage bias value Vbias based on PVT conditions. As shown, Vbias can be coupled to word lines wwl of the model array comprising SRAM cells 130. Representatively, if Vbias falls below an acceptable value, a corresponding SRAM cell 130 can behave as a weak cell. Accordingly, in one embodiment, Vbias is tuned to a value that is less than the supply voltage value Vdd, such that SRAM cell 130 can be configured as a weak cell. For example, Vbias can be tuned to a value that is ~100 mV below Vdd, and the corresponding SRAM cell 130 can represent a weak cell which is harder to write. WS circuit 100 can be configured to provide write assist, such as a word-line boost, where such weak SRAM cells 130 are harder to write in the absence of such write assist. Detecting conditions pertaining to weak cells and providing word line boosts can be implemented in exemplary embodiments in the following manner.

Input signal probe_clk 112 can be used to cause control and bias circuit 110 to generate Vbias 114. Control and bias circuit 110 can also generate a trigger signal, trig 124. As shown in FIG. 1, trig 124 can propagate through programmable logic delay line 120 on one hand to generate a first reference clock (ref_lat) 122; and through the array of parallel (m cells) and series (n columns) of SRAM cells 130 on the other hand to generate a second reference clock (ref_lat) 164. Programmable delay line 120 can comprise one or more inverter pairs which can be configured to generate a programmable delay. Representatively, the programmable delay can be based on an acceptable delay value through the model array of SRAM cells 130, beyond which the external array can be determined to require a word-line boost. Due to averaging across the model array of SRAM cells 130 and based on Vbias, the ripple delay through the model array can track the mean write delay of a weak cells. In other words, if the delay through the model m×n array of SRAM cells 130 is greater than an acceptable delay value, it can be determined that these SRAM cells 130 are weak cells which are harder to write, and thus, which require a write assist, such as a word-line boost. Correspondingly, a write assist in the form of a word-line boost may be supplied to the external SRAM array.

Accordingly, sense-amplifier logic 160 can include a latch and can be used to compare the times at which the first reference clock ref_lat 122 and the second reference clock in_lat 164 arrive at sense-amplifier logic 160. If in_lat 164 arrives concurrently with or after ref_lat 122 (i.e. the delay through the model array of SRAM cells 130 is greater than the acceptable delay), then the signal write word-line boost 162 can be asserted. Word-line boost 162 may then be used to provide write assist in the form of a word-line boost to the external SRAM array.

As shown in FIG. 1, WS circuit 100 may also include an input signal write sense enable 113, which can be used to enable WS circuit 100. Accordingly, using write sense enable 113, WS circuit 100 can be woken up at selected time intervals. For example, WS circuit 100 may be probed and activated once every few hundred cycles in order to keep track of dynamic operating conditions. Thereafter, WS circuit 100 can return to sleep mode after having performed above-described functions to generate a writeability indicator (e.g. write word-line boost 162) as needed. The feedback path 123 can be used to reset WS circuit 100 and place it in a ready condition to await a next probe.

Figure 3:
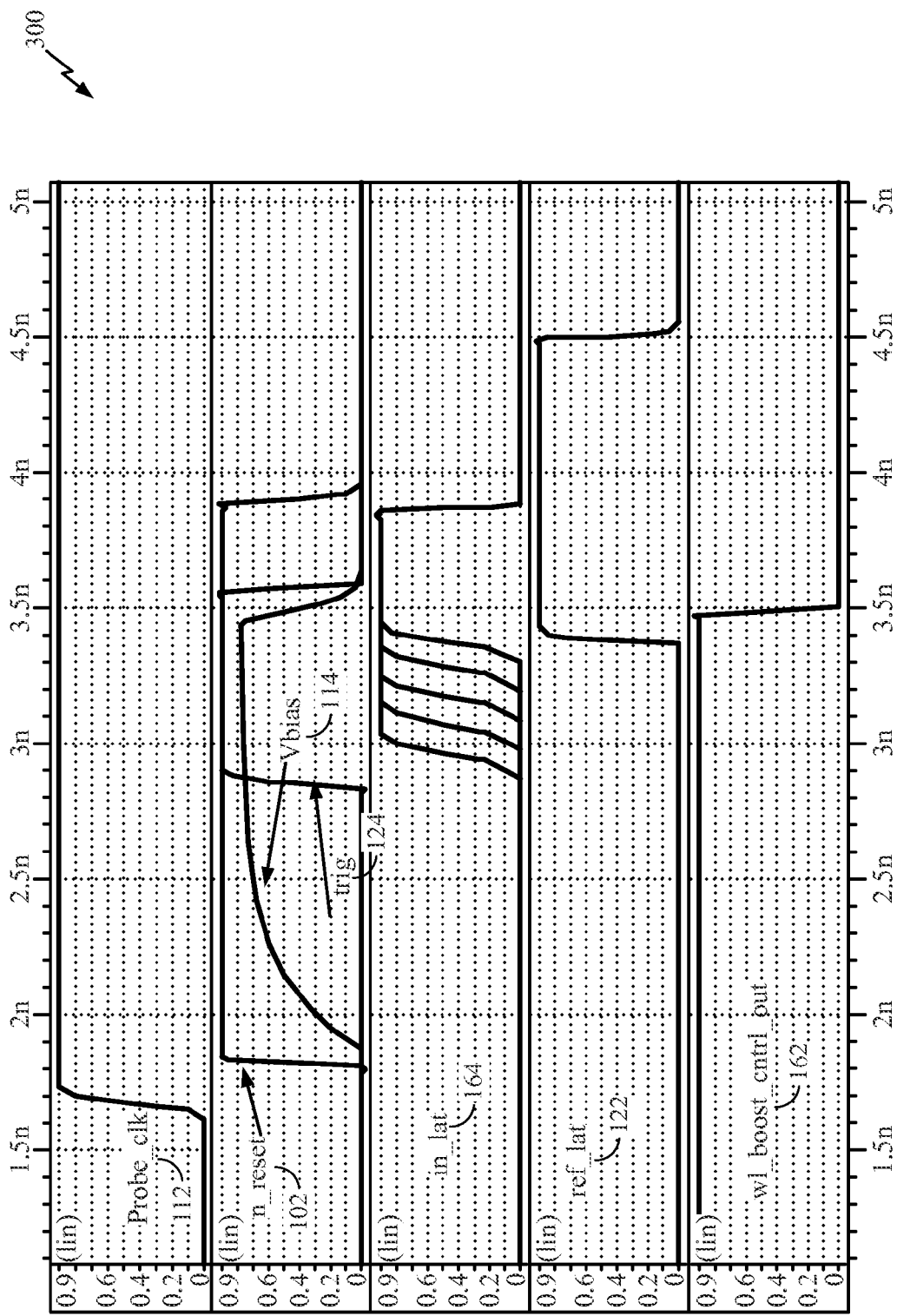
FIG. 3 is a diagram illustrating a write sensor circuit waveform for enabling a write word-line voltage boost according to an aspect of the present disclosure.

Coming now to FIG. 3, an exemplary timing diagram 300 corresponding to the above-described signals of WS circuit 100 is illustrated. As illustrated, a model array of SRAM cells 130 may be initialized, for example, through differential reset ports, reset 204 and n_reset 202 coupled to signals reset 104 and n_reset 102 respectively. Vbias can be initialized to an initial value which can be ~100 mV below Vdd. Programmable delay line 120 can be programmed to a delay value which represents an acceptable delay beyond which a write word-line boost can be determined to be required. As previously described, the acceptable delay value can correspond to a threshold voltage value, and thus, the threshold voltage value can be adjusted by programming the delay value of programmable delay line 120. Signal transition for trig 124 can be rippled across the bit-lines and storage nodes of the array of SRAM cells 130 to generate in_lat 164 as well as through programmable delay line 120 to generate ref_lat 122. Sense-amplifier logic 160 can be used to determine whether to assert write word-line boost 162 based on arrival times of ref_lat 122 and in_lat 164.

With reference now to Table 1 below, exemplary conditions such as PVT conditions are tabulated alongside corresponding bias voltage values requiring write word-line boosts. In Table 1, nmos devices are represented as "N" and pmos devices are represented as "P." Correspondingly, "slow" and "fast" prefixes for N and P relate to process conditions affecting SRAM cells. Table 1 shows threshold voltage values at which the output of sense-amplifier logic 160 toggles. More particularly, Table 1 relates to statistical simulation of WS circuit 100, and illustrates mean and sigma values of these threshold voltages. It will be seen that when supply voltage Vdd falls below corresponding threshold voltages, the output of sense-amplifier logic 160 will toggle, thus indicating that a corresponding weak SRAM cell would require write assist, for example, in the form of corresponding word-line boost.

From circuit simulations on a weak SRAM bit, it can be seen that the voltage below which write assist is needed is a function of temperature and process conditions. At a lower temperature, the threshold voltage for write assist is higher than the threshold voltage for write assist at a higher temperature. Similarly, at a "slow N, fast P" process condition the threshold voltage is higher than the threshold voltage for a "fast N, slow P" condition. As shown, the threshold voltages track the voltage at which write assist is required for SRAM cells, across varying process and temperature conditions. More particularly, mean/sigma threshold voltage values track well with the expected bias voltage values for write word lines without a word-line boost. As can be seen from Table 1, this threshold voltage is highest at lower temperatures and "slow N, fast P" conditions.

TABLE 1

| Temp/Corner | Slow N, fast P | Slow N, slow P | Typical N, Typical P | Fast N, Fast P | Fast N, slow P |
|---|---|---|---|---|---|
| −30° C. | 0.83, 0.04 | 0.8, 0.04 | 0.78, 0.04 | 0.75, 0.035 | 0.73, 0.035 |
| 125° C. | 0.72, 0.035 | 0.7, 0.035 | 0.68, 0.03 | 0.65, 0.03 | 0.63, 0.03 |

Figure 4:
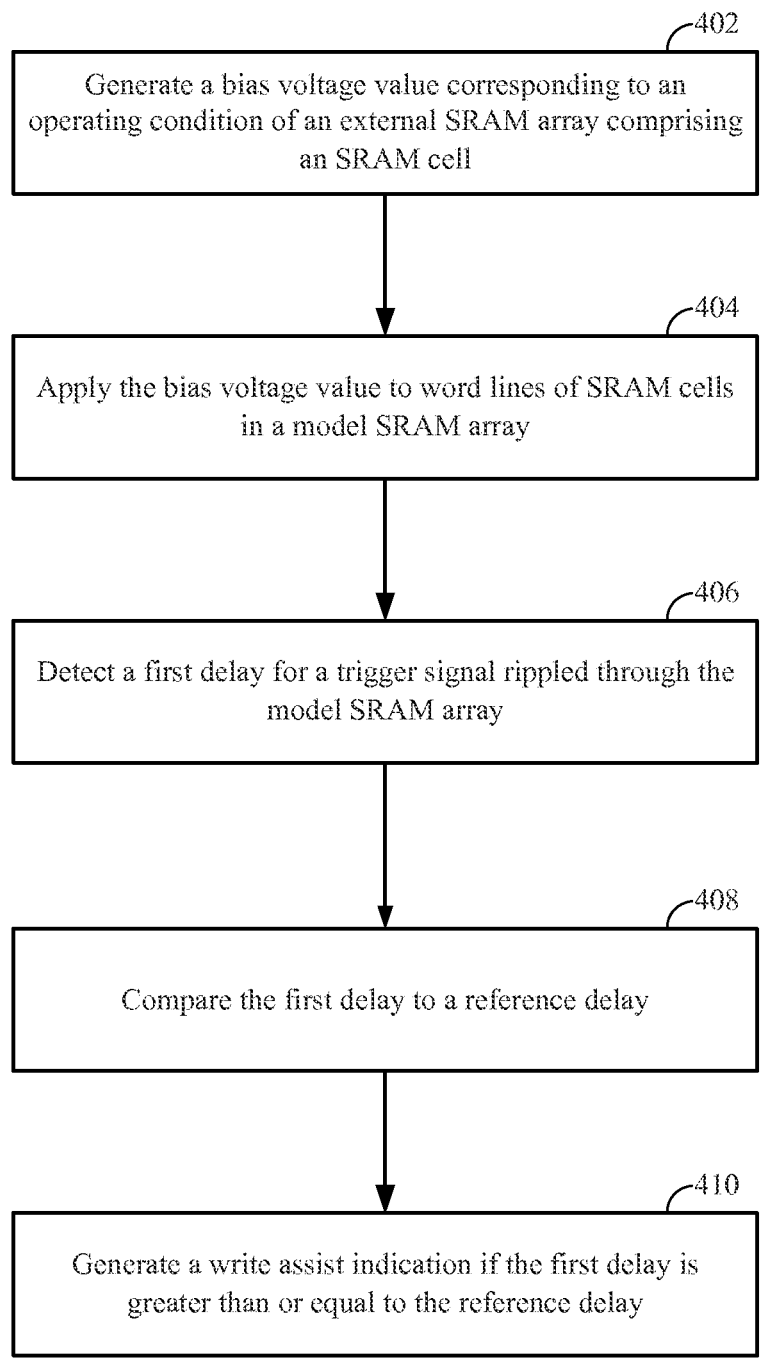
FIG. 4 illustrates a flow chart corresponding to a method of improving writeability of a static random access memory (SRAM) cell, according to exemplary embodiments.

It will be appreciated that embodiments include various methods for performing the processes, functions and/or algorithms disclosed herein. For example, as illustrated in FIG. 4, an embodiment can include a method of improving writeability of a static random access memory (SRAM) cell, the method comprising: generating a bias voltage value (e.g., Vias 114) corresponding to an operating condition of an external SRAM array comprising the SRAM cell—Block 402; applying the bias voltage value to word lines of SRAM cells in a model SRAM array (e.g., m×a array comprising SRAM cells 130)—Block 404; detecting a first delay (e.g., for ref_lat 122) for a trigger signal (e.g., trig 124) rippled through the model SRAM array—Block 406; comparing the first delay to a reference delay (e.g., ref_lat 164)—Block 408; and generating a write assist indication (e.g., write word-line boost 162) if the first delay is greater than or equal to the reference delay—Block 410.

Figure 5:
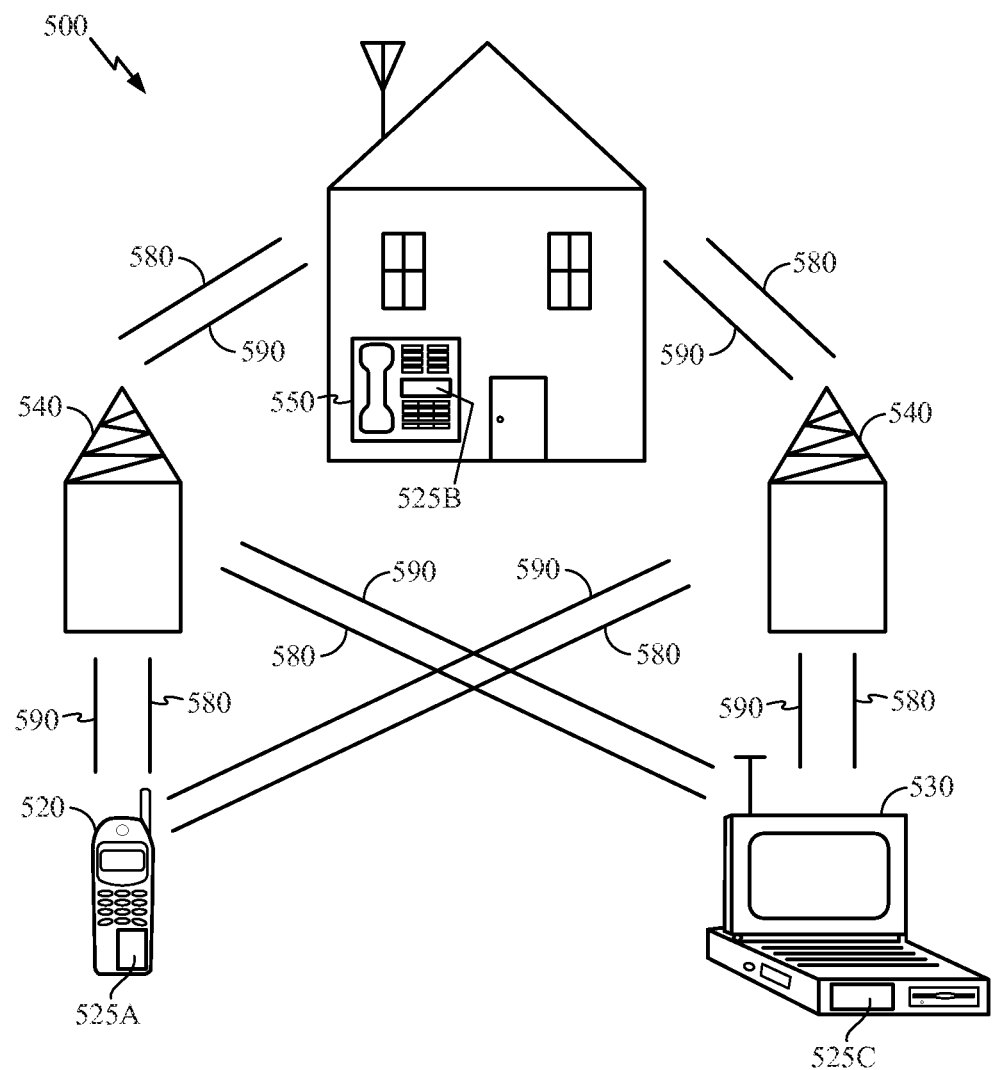
FIG. 5 is a block diagram showing an exemplary wireless communication system in which aspects of the disclosure may be advantageously employed.

With reference to FIG. 5, an exemplary wireless communication system 500 is illustrated, in which an embodiment of the disclosure may be advantageously employed. For purposes of illustration, FIG. 5 shows three remote units 520, 530, and 550 and two base stations 540. It will be recognized that typical wireless communication systems may have many more remote units and base stations. Remote units 520, 530, and 550 include improved a write sensor for selective write word-line boosting circuitry 525A, 52513, and 525C, respectively, Which are aspects of the disclosure as discussed further below. FIG. 5 shows forward link signals 580 from the base stations 540 and the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 5 illustrates remote units according to the teachings of the disclosure, the disclosure is not limited to these exemplary illustrated units. The disclosure may be suitably employed in any device which includes a write sensor for selective word line boosting.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for generating a write word-line boost in memory arrays. Accordingly, the invention is not limited to illustrated examples and any means for performing the functionality described herein are included in embodiments of the invention.

While the foregoing disclosure shows illustrative embodiments of invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of improving writeability of a static random access memory (SRAM) cell, the method comprising:
   generating a bias voltage value corresponding to an operating condition of an external SRAM array comprising the SRAM cell;
   applying the bias voltage value to word lines of SRAM cells in a model SRAM array;
   detecting a first delay for a trigger signal rippled through the model SRAM array;
   comparing the first delay to a reference delay, wherein the reference delay is generated by passing the trigger signal through a programmable delay line of programmed delay; and
   generating a write assist indication if the first delay is greater than or equal to the reference delay.

2. The method of claim 1, wherein the programmed delay corresponds to a threshold voltage, wherein a supply voltage below the threshold voltage applied to an SRAM cell negates writeability of the SRAM cell.

3. The method of claim 1, wherein the generated write assist indication is used to increase a supply voltage value of the external SRAM array.

4. The method of claim 1, wherein the operating condition comprises at least one of a process, a voltage, or a temperature operation condition that indicates a cell write failure condition.

5. The method of claim 1, wherein the model SRAM array comprises a combination of parallel and series connected SRAM cells.

6. The method of claim 1, wherein the write assist indication further comprises an indication of a degree of writeability, wherein an increase in a level of write assist corresponds to an amount of time the first delay exceeds the reference delay.

7. An apparatus comprising:
control logic to detect a condition in which a simulated write delay within a model static random access memory (SRAM) array exceeds a programmable delay value, in which an output of the control logic is to enable a write assist in an external SRAM array.

8. The apparatus of claim 7, in which the control logic comprises:
a control block to assert a trigger signal in response to at least one of a process, a voltage, and a temperature operation condition that indicates a write failure condition corresponding to one or more cells of the external SRAM array.

9. The apparatus of claim 7, in which the control logic comprises
a variable delay line coupled to receive a trigger signal and to output a first reference clock signal;
a combination of parallel and series connected bit-cells of the model SRAM array coupled in parallel to the variable delay line to output a second reference clock signal; and
a logic gate coupled to the variable delay line and the bit-cells of the model SRAM array to receive the first and second reference clock signals, the logic gate to assert a write assist indication when the second reference clock signal is received concurrent with or after the first reference clock signal.

10. The apparatus of claim 7, in which a voltage generation circuit is operable in response to the write assist.

11. The apparatus of claim 7, in which a level of write assist depends on an amount of time the simulated delay exceeds the programmable delay value.

12. The apparatus of claim 7, in which the programmable delay value is set according to a programmable delay line of logic gates.

13. The apparatus of claim 7, in which the write assist is a write word-line boost operation.

14. A system for improving writeability of a static random access memory (SRAM) cell present in an external SRAM array, the system comprising:
means for detecting a condition in which a simulated write delay within a model static random access memory (SRAM) array exceeds a programmable delay value, in which an output of the control logic is to enable a write assist in the external SRAM array.

15. The system of claim 14, in which the means for detecting comprises:
means for asserting a trigger signal in response to at least one of a process, a voltage, and a temperature operation condition that indicates a write failure condition of the SRAM cell.

16. The system of claim 14, in which the means for detecting comprises
means for receiving a trigger signal and outputting a first reference clock signal after a variable delay;
means for generating a second reference clock based on a combination of parallel and series connected bit-cells of the model SRAM array;
means for receiving the first and second reference clock signals, and means for asserting a write assist indication when the second reference clock signal is received concurrent with or after the first reference clock signal.

17. The system of claim 14, in a voltage generation means is operable in response to the write assist.

18. The system of claim 14, in which a level of the write assist depends on an amount of time the simulated delay exceeds the programmable delay value.

19. A non-transitory computer-readable storage medium comprising code, which, when executed by a processor, causes the processor to perform operations for improving writeability of a static random access memory (SRAM) cell, the non-transitory computer-readable storage medium comprising:
code for generating a bias voltage value corresponding to an operating condition of an external SRAM array comprising the SRAM cell;
code for applying the bias voltage value to word lines of SRAM cells in a model SRAM array;
code for detecting a first delay for a trigger signal rippled through the model SRAM array;
code for comparing the first delay to a reference delay, wherein the reference delay is generated by passing the trigger signal through a programmable delay line of programmed delay; and
code for generating a write assist indication if the first delay is greater than or equal to the reference delay.

20. The non-transitory computer-readable storage medium of claim 19, wherein the programmed delay corresponds to a threshold voltage, wherein a supply voltage below the threshold voltage applied to an SRAM cell negates writeability of the SRAM cell.

21. The non-transitory computer-readable storage medium of claim 19, wherein the generated write assist indication is used to increase a supply voltage value of the external SRAM array.

22. The non-transitory computer-readable storage medium of claim 19, wherein the operating condition comprises at least one of a process, a voltage, or a temperature operation condition that indicates a cell write failure condition.

* * * * *